(12) United States Patent
Hamanaka

(10) Patent No.: US 6,337,272 B1
(45) Date of Patent: Jan. 8, 2002

(54) METHOD OF MANUFACTURING A SEMICONDUCTOR DEVICE

(75) Inventor: Nobuaki Hamanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/505,666

(22) Filed: Feb. 17, 2000

(30) Foreign Application Priority Data

Feb. 24, 1999 (JP) ............................................. 11-045639

(51) Int. Cl.⁷ ............................................. H01L 21/302
(52) U.S. Cl. .................. 438/651; 438/142; 438/299; 438/301; 438/305; 438/649; 438/658; 438/683; 438/721; 438/749; 438/75; 257/43; 257/757; 257/754; 257/768
(58) Field of Search ...................... 438/142, 299, 438/301, 305, 649, 651, 655, 683, 721, 749, 754; 257/43, 757, 754, 768

(56) References Cited

U.S. PATENT DOCUMENTS

| | | | | |
|---|---|---|---|---|
| 5,780,361 A | * | 7/1998 | Inoue | 438/683 |
| 5,877,085 A | * | 3/1999 | Matsubara | 438/649 |
| 5,899,720 A | * | 5/1999 | Mikagi | 438/303 |
| 5,970,370 A | * | 10/1999 | Besser et al. | 438/586 |
| 6,074,960 A | * | 6/2000 | Lee et al. | 438/749 |

FOREIGN PATENT DOCUMENTS

| | | |
|---|---|---|
| JP | 8-74045 | 3/1996 |
| JP | 2-820122 | 8/1998 |

* cited by examiner

*Primary Examiner*—Charles Bowers
*Assistant Examiner*—Lisa Kilday
(74) *Attorney, Agent, or Firm*—Sughrue Mion, PLLC

(57) ABSTRACT

A method of manufacturing a semiconductor device in which a cobalt silicide layer is formed on a semiconductor substrate. In the method, the semiconductor substrate is prepared, and cobalt is deposited on the semiconductor substrate by sputtering while heating the semiconductor substrate at a temperature approximately equal to 200 degrees Celsius. Thereafter, cobalt is deposited on the semiconductor substrate by sputtering while heating the semiconductor substrate at a temperature between 300 degrees Celsius and 400 degrees Celsius without exposing the semiconductor substrate to the atmosphere. Preferably, the semiconductor substrate is thereafter rapid thermal annealed at a temperature equal to or higher than 500 degrees Celsius in nitrogen atmosphere for a predetermined time. Further, at least a part of cobalt portion or cobalt oxide portion on the semiconductor substrate is removed by wet etching.

28 Claims, 8 Drawing Sheets

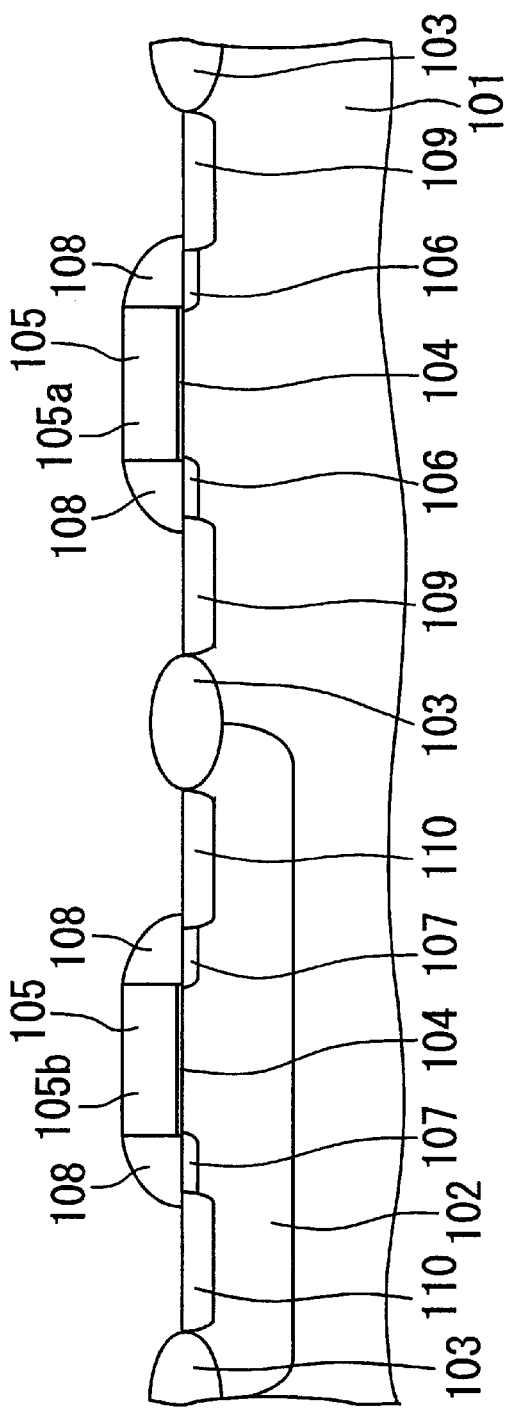
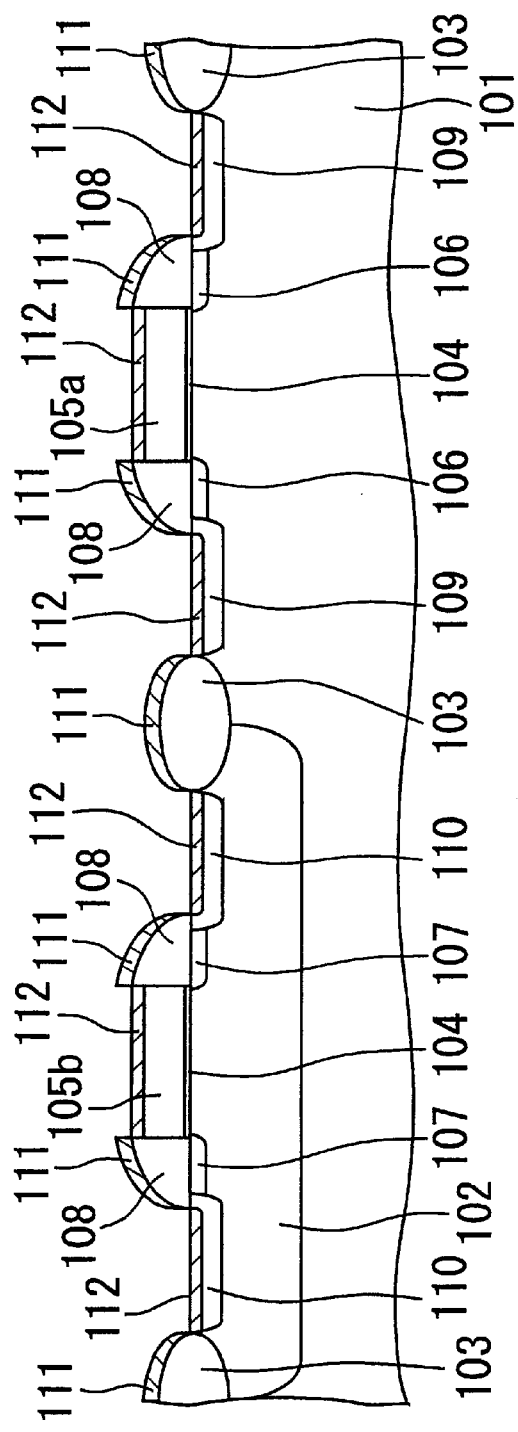
FIG. 1A
FIG. 1B

SHEET RESISTANCE OF COBALT SILICIDE FILM ON
N-TYPE GATE ELECTRODE OR P-TYPE GATE ELECTRODE.

SHEET RESISTANCE OF COBALT SILICIDE FILM ON
N-TYPE DIFFUSION LAYER OR P-TYPE DIFFUSION LAYER.

SHEET RESISTANCE OF COBALT SILICIDE FILM ON
N-TYPE GATE ELECTRODE OR P-TYPE GATE ELECTRODE.

SHEET RESISTANCE OF COBALT SILICIDE FILM ON
N-TYPE DIFFUSION LAYER OR P-TYPE DIFFUSION LAYER.

METHOD OF MANUFACTURING A SEMICONDUCTOR DEVICE

FIELD OF THE INVENTION

The present invention relates generally to a method of manufacturing a semiconductor device. More particularly, the present invention relates to a method of manufacturing a semiconductor device in which, in order to lower resistance of a P-type gate electrode, a P type source/drain region, an N type gate electrode and an N type source/drain region, a metal silicide layer having substantially equal sheet resistance can be formed simultaneously on each of these electrodes and regions in a self aligned manner.

BACKGROUND OF THE INVENTION

A conventional SALICIDE process, that is, a self-aligned silicide process, which is known as one of semiconductor device manufacturing methods, is disclosed in Japanese patent laid-open publication No. 8-069497. With reference to the drawings, description will be made on such conventional method of manufacturing a semiconductor device.

FIGS. 7A and 7B and FIGS. 8A and 8B are illustrations, in order of process steps, of cross-sectional views of a portion of a semiconductor device substrate obtained after respective process steps according to the conventional method of manufacturing a semiconductor device.

First, as shown in FIG. 7A, an N type well 202 is formed at an area of a silicon wafer or silicon substrate 201 where a P channel transistor is to be formed, by using a known method, for example, an ion implantation method and the like. Then, on the surface of the silicon substrate 201, a field oxide film 203 is formed by using a selective oxidation method. A gate insulating film 204 made of silicon oxide film and the like is then formed in an active area surrounded by the field oxide film 203, and a polycrystalline silicon (polysilicon) film which becomes a gate electrode is formed on the gate insulating film 204. Phosphorus is then doped into the polysilicon film by using a known method, thereby electrical resistivity of the polysilicon film is lowered. Thereafter, by using a well known photolithography method and a well known dry etching method, the polysilicon film is patterned, and the gate electrode 205 is formed as shown in FIG. 7A.

Next, by an ion implantation method which uses the gate electrode 205, the field oxide film 203 and a resist film formed by a photolithography method and not shown in the drawing as a mask, N type impurity diffused layers 206 having a predetermined low impurity concentration are formed in an active area of the silicon substrate 201 in which an N channel transistor is to be formed. Similarly, by an ion implantation method which uses the gate electrode 205, the field oxide film 203 and a resist film formed by a photolithography method and not shown in the drawing as a mask, P type impurity diffused layers 207 having a predetermined low impurity concentration are formed in the N type well 202. Thereafter, on side surfaces of the gate electrode 205, sidewall spacers 208 made of silicon oxide films or silicon nitride films are formed by using a known CVD technology and a known etching technology.

Thereafter, by an ion implantation method which uses the gate electrode 205, the sidewall spacers 208, the field oxide film 203 and a resist film formed by a photolithography method and not shown in the drawing as a mask, N type source/drain regions 209 having a higher impurity concentration than that of the N type impurity diffusion layers 206 are formed in an active area of the silicon substrate 201 in which the N channel transistor is to be formed. Similarly, by an ion implantation method which uses the gate electrode 205, the sidewall spacers 208, the field oxide film 203 and a resist film formed by a photolithography method and not shown in the drawing as a mask, P type source/drain regions 210 having a higher impurity concentration than that of the P type impurity diffused layers 207 are formed in the N type well 202. After the ion implantation, heat treatment process is performed if necessary. By these process steps, the N type source/drain region 209 and the P type source/drain region 210 are formed as a lightly doped drain (LDD) structure. Thereby, the structure shown in FIG. 7A is obtained.

It should be noted that, in the ion implantation process for forming the N type source/drain region 209 and the ion implantation process for forming the P type source/drain region 210, the gate electrode 205 is used as a mask and impurities are also injected into the gate electrode 205. Therefore, the gate electrode 205 on the side of the N channel transistor has N conductivity type at least at an upper portion thereof, and is called an N type gate electrode 205a hereafter. Also, the gate electrode 205 on the side of the P channel transistor has P conductivity type at least at an upper portion thereof, and is called a P type gate electrode 205b hereafter.

Then, a native oxide film not shown in the drawing and formed on the surface of the polysilicon film as the gate electrode and on the surface of the silicon substrate is removed by etching and the like. The substrate is then placed into a chamber of a magnetron sputtering apparatus not shown in the drawing. Cobalt, which is a metal having a high melting point, is deposited by sputtering on whole surface of the substrate while heating the substrate at a temperature from 200 degrees Celsius to 500 degrees Celsius, for example, at 450 degrees Celsius. Thereby, as shown in FIG. 7B, a cobalt film 211 is formed on the field oxide film 203, the sidewall spacers 208 and the like. On the other hand, a cobalt film deposited on the N type gate electrode 205a, the P type gate electrode 205b, the N type source/drain region 209 and the P type source/drain region 210 chemically reacts with underlying material, that is, single crystalline silicon or polysilicon via surface reaction to form a dicobalt monosilicide ($Co_2Si$) film 212.

However, according to an analysis by the inventor of the present invention, as shown in FIG. 7B, it has been found that, among portions of the dicobalt monosilicide ($Co_2Si$) film formed on the N type gate electrode 205a, the P type gate electrode 205b, the N type source/drain region 209 and the P type source/drain region 210, portions of the dicobalt monosilicide in dicobalt monosilicide ($Co_2Si$) film 212a formed on the P type gate electrode 205b and the P type source/drain region 210 further chemically react with silicon to produce cobalt monosilicide (CoSi). It has also been found that, on the upper portion of dicobalt monosilicide ($Co_2Si$) film 212a formed on the P type gate electrode 205b and the P type source/drain region 210, a cobalt film portion 211a is left unreacted.

Next, as shown in FIG. 8A, a rapid thermal annealing (RTA) process is performed in nitrogen atmosphere at a temperature equal to or higher than 500 degrees Celsius. Thereby, reaction of the dicobalt monosilicide ($Co_2Si$) portions and cobalt monosilicide portions on the N type gate electrode 205a, the P type gate electrode 205b, the N type source/drain region 209 and the P type source/drain region 210 is further progressed and a film 213 comprising cobalt monosilicide and/or cobalt disilicide ($CoSi_2$) is formed.

The cobalt film 211 existing on the field oxide film 203 and the sidewall spacers 208 becomes a film in which a part of, for example, the surface portion of, the film is oxidized. Also, according to an analysis by the inventor of the present invention, it has been found that the cobalt film portion 211a existing on the upper portion of the dicobalt monosilicide ($Co_2Si$) film 212a formed on the P type gate electrode 205b and the P type source/drain region 210 also becomes a film in which a part of, for example, the surface portion of, the film is oxidized.

As shown in FIG. 8B, the substrate is then immersed in a mixed aqueous solution of hydrochloric acid and hydrogen peroxide. By such wet etching, the cobalt film portion which is left unreacted or which is partially oxidized is selectively removed. Then, an RTA process is performed at a temperature higher than that of the above-mentioned RTA, for example, at 800 degrees Celsius. By this process, cobalt monosilicide in the film 213 is completely reacted to form the cobalt disilicide film 214. Thereby, a structure shown in FIG. 8B is obtained.

In the semiconductor device in which a metal silicide film such as the cobalt disilicide film 214 is formed on the gate electrodes and the source/drain regions by using the conventional manufacturing method mentioned above, a sheet resistance value of the metal silicide film on the P type gate electrode and the P type source/drain region becomes large when compared with a sheet resistance value of the metal silicide film on the N type gate electrode and the N type source/drain region. Thus, there arises a problem that an operation speed of the P type transistor becomes slower when compared with an operation speed of the N type transistor.

The inventor of the present invention carried out research into causes of such problem. In the above-mentioned conventional SALICIDE process, that is, self-aligned silicide process, sputtering of cobalt is performed in one step, and deposited cobalt is silicified to form cobalt silicide film. In this case, it has been found that, since a reaction rate of silicification on the N type gate electrode 205a and the N type source/drain region 209 and that on the P type gate electrode 205b and the P type source/drain region 210 differ from each other, phases of the cobalt silicide films formed immediately after the sputtering differ from each other. The causes of this are considered to be as follows.

On the N type gate electrode 205a and the N type source/drain region 209 made of N type silicon, the dicobalt monosilicide ($Co_2Si$) phase is thermodynamically stable. Taking the temperature of the substrate in the sputtering of the above-mentioned conventional method into consideration, metal cobalt deposited on the N type gate electrode 205a and the N type source/drain region 209 by sputtering chemically reacts with silicon to produce dicobalt monosilicide, but it is hardly considered that the produced dicobalt monosilicide further chemically reacts with silicon to produce cobalt monosilicide (CoSi).

On the other hand, on the P type gate electrode 205b and the P type source/drain region 210 made of P type silicon, thermodynamic potential of the dicobalt monosilicide ($Co_2Si$) phase is higher than those of the cobalt monosilicide (CoSi) phase and the metal cobalt (Co) phase, and the dicobalt monosilicide ($Co_2Si$) phase is thermodynamically unstable. Therefore, taking the temperature of the substrate in the sputtering of the above-mentioned conventional method into consideration, metal cobalt deposited on the P type gate electrode 205b and the P type source/drain region 210 by sputtering chemically reacts with silicon to produce dicobalt monosilicide, and, at the same time, a part of the produced dicobalt monosilicide further chemically reacts with silicon to produce cobalt monosilicide (CoSi). Thus, on the P type gate electrode 205b and the P type source/drain region 210, dicobalt monosilicide, which is produced by the chemical reaction of previously deposited cobalt with silicon, further chemically reacts with silicon to produce cobalt monosilicide. To this end, as sputtering progresses, it becomes gradually hard for newly deposited cobalt at the most outer surface portion to diffuse.

Therefore, cobalt which is deposited later becomes more difficult to cause reaction for producing dicobalt monosilicide, and a part of the cobalt deposited later remains as a cobalt film portion without undergoing the reaction. Thus, there exists a cobalt film on the film comprising dicobalt monosilicide and cobalt monosilicide which is on the P type gate electrode 205b and the P type source/drain region 210. This cobalt film does not undergo reaction, and is cooled and exposed to the atmosphere, so that a part of or whole of the cobalt film is oxidized. The oxidized portion of the cobalt film is not silicified even in the RTA process performed after the sputtering, and is removed by the wet etching performed after the RTA process. Therefore, the thickness of the cobalt disilicide ($CoSi_2$) film 214 finally formed on the P type gate electrode 205b and the P type source/drain region 210 becomes thinner than that of the cobalt disilicide ($CoSi_2$) film 214 finally formed on the N type gate electrode 205a and the N type source/drain region 209.

In the above-mentioned conventional technique, it has become apparent, by such reasons, that a sheet resistance value of the metal silicide film on the P type gate electrode and the P type source/drain region becomes large when compared with a sheet resistance value of the metal silicide film on the N type gate electrode and the N type source/drain region, and that an operation speed of the P type transistor becomes slower when compared with an operation speed of the N type transistor.

SUMMARY OF THE INVENTION

Therefore, it is an object of the present invention to provide a method of manufacturing a semiconductor device in which a metal silicide film having low resistance can be formed on a semiconductor substrate without being influenced by the grounding layer.

It is another object of the present invention to provide a method of manufacturing a semiconductor device in which a metal silicide film having low resistance can be formed on a semiconductor substrate without being influenced by the grounding layer, when the metal silicide film is formed on the semiconductor substrate by depositing a metal having a high melting point by sputtering on the semiconductor substrate and by reacting the metal with the grounding layer.

It is still another object of the present invention to provide a method of manufacturing a semiconductor device in which a cobalt silicide film having substantially equal sheet resistance can be formed on both a region comprising P type silicon and a region comprising N type silicon, simultaneously and in a self-aligned manner.

It is still another object of the present invention to provide a method of manufacturing a semiconductor device in which a cobalt silicide film having substantially equal thickness can be formed on both a region comprising P type silicon and a region comprising N type silicon, simultaneously and in a self-aligned manner.

It is still another object of the present invention to provide a method of manufacturing a semiconductor device in which wiring resistance of a P type gate electrode and a P type source/drain region can be made as low as that of an N type gate electrode and an N type source/drain region.

It is still another object of the present invention to provide a method of manufacturing a semiconductor device in which a metal silicide film having substantially equal sheet resistance can be formed on a P type gate electrode, a P type source/drain region, an N type gate electrode and an N type source/drain region, simultaneously and in a self-aligned manner.

It is still another object of the present invention to provide a method of manufacturing a semiconductor device in which a metal silicide film having substantially equal thickness can be formed on a P type gate electrode, a P type source/drain region, an N type gate electrode and an N type source/drain region, simultaneously and in a self-aligned manner.

It is still another object of the present invention to provide a method of manufacturing a semiconductor device in which an operation speed of a P channel MOS transistor can be as fast as that of an N channel MOS transistor.

According to an aspect of the present invention, there is provided a method of manufacturing a semiconductor device in which a cobalt silicide layer is formed on a semiconductor substrate, the method comprising: preparing the semiconductor substrate; depositing cobalt on the semiconductor substrate by sputtering while heating the semiconductor substrate at a temperature approximately equal to 200 degrees Celsius; and after the depositing cobalt on the semiconductor substrate by sputtering while heating the semiconductor substrate at a temperature approximately equal to 200 degrees Celsius, depositing cobalt on the semiconductor substrate by sputtering while heating the semiconductor substrate at a temperature between 300 degrees Celsius and 400 degrees Celsius, without exposing the semiconductor substrate to the atmosphere.

In this case, it is preferable that the semiconductor substrate is a silicon substrate.

It is also preferable that the cobalt silicide layer is a self-aligned silicide layer.

It is further preferable that the method further comprises, after the depositing cobalt on the semiconductor substrate by sputtering while heating the semiconductor substrate at a temperature between 300 degrees Celsius and 400 degrees Celsius, rapid thermal annealing the semiconductor substrate at a temperature equal to or higher than 500 degrees Celsius in nitrogen atmosphere for a predetermined time.

It is advantageous that the method comprises, after rapid thermal annealing the semiconductor substrate at a temperature equal to or higher than 500 degrees Celsius in nitrogen atmosphere for a predetermined time, removing at least a part of cobalt portion or cobalt oxide portion on the semiconductor substrate by wet etching.

It is also advantageous that the method further comprises, after removing at least a part of cobalt portion or cobalt oxide portion on the semiconductor substrate by wet etching, additionally rapid thermal annealing the semiconductor substrate for a predetermined time at a temperature higher than the temperature in the rapid thermal annealing semiconductor substrate at a temperature equal to or higher than 500 degrees Celsius in nitrogen atmosphere for a predetermined time.

It is further advantageous that the method further comprises, after the preparing semiconductor substrate and before the depositing cobalt on the semiconductor substrate by sputtering while heating the semiconductor substrate at a temperature approximately equal to 200 degrees Celsius, forming at least one of a gate electrode and an impurity diffusion layer, on the semiconductor substrate.

It is also preferable that the method further comprises, after the preparing semiconductor substrate and before the depositing cobalt on the semiconductor substrate by sputtering while heating the semiconductor substrate at a temperature approximately equal to 200 degrees Celsius, forming a P type gate electrode, an N type gate electrode, a P type source/drain region and an N type source/drain region, on the semiconductor substrate.

It is also preferable that, in the depositing cobalt on the semiconductor substrate by sputtering while heating the semiconductor substrate at a temperature approximately equal to 200 degrees Celsius and in the depositing cobalt on the semiconductor substrate by sputtering while heating the semiconductor substrate at a temperature between 300 degrees Celsius and 400 degrees Celsius, the cobalt is deposited simultaneously on the P type gate electrode, the N type gate electrode, the P type source/drain region and the N type source/drain region.

It is further preferable that the cobalt silicide layer is formed in a self-aligned manner on the P type gate electrode, the N type gate electrode, the P type source/drain region and the N type source/drain region, by silicification of cobalt deposited on the P type gate electrode, the N type gate electrode, the P type source/drain region and the N type source/drain region.

According to another aspect of the present invention, there is provided a method of manufacturing a semiconductor device in which a cobalt silicide layer is formed on a semiconductor substrate, the method comprising: preparing the semiconductor substrate; depositing cobalt on the semiconductor substrate by sputtering while heating the semiconductor substrate at a temperature approximately equal to 200 degrees Celsius; and after the depositing cobalt on the semiconductor substrate by sputtering while heating the semiconductor substrate at a temperature approximately equal to 200 degrees Celsius, heating the cobalt deposited on the semiconductor substrate at a temperature between 300 degrees Celsius and 400 degrees Celsius for 2 minutes or more, without exposing the semiconductor substrate to the atmosphere.

It is preferable that the semiconductor substrate is a silicon substrate.

It is also preferable that the cobalt silicide layer is a self-aligned silicide layer.

It is further preferable that the method further comprises, after the heating the cobalt on the semiconductor substrate at a temperature between 300 degrees Celsius and 400 degrees Celsius for 2 minutes or more, rapid thermal annealing the semiconductor substrate at a temperature equal to or higher than 500 degrees Celsius in nitrogen atmosphere for a predetermined time.

It is advantageous that the method further comprises, after rapid thermal annealing the semiconductor substrate at a temperature equal to or higher than 500 degrees Celsius in nitrogen atmosphere for a predetermined time, removing at least a part of cobalt portion or cobalt oxide portion on the semiconductor substrate by wet etching.

It is also advantageous that the method further comprises, after removing at least a part of cobalt portion or cobalt oxide portion on the semiconductor substrate by wet etching, additionally rapid thermal annealing the semiconductor substrate for a predetermined time at a temperature higher than the temperature in the rapid thermal annealing semiconductor substrate at a temperature equal to or higher than 500 degrees Celsius in nitrogen atmosphere for a predetermined time.

It is further advantageous that the method further comprises, after the preparing semiconductor substrate and before the depositing cobalt on the semiconductor substrate by sputtering while heating the semiconductor substrate at a temperature approximately equal to 200 degrees Celsius, forming at least one of a gate electrode and an impurity diffusion layer, on the semiconductor substrate.

It is preferable that the method further comprises, after the preparing semiconductor substrate and before the depositing cobalt on the semiconductor substrate by sputtering while heating the semiconductor substrate at a temperature approximately equal to 200 degrees Celsius, forming a P type gate electrode, an N type gate electrode, a P type source/drain region and an N type source/drain region, on the semiconductor substrate.

It is also preferable that, in the depositing cobalt on the semiconductor substrate by sputtering while heating the semiconductor substrate at a temperature approximately equal to 200 degrees Celsius, the cobalt is deposited simultaneously on the P type gate electrode, the N type gate electrode, the P type source/drain region and the N type source/drain region.

It is further preferable that the cobalt silicide layer is formed in a self-aligned manner on the P type gate electrode, the N type gate electrode, the P type source/drain region and the N type source/drain region, by silicification of cobalt deposited on the P type gate electrode, the N type gate electrode, the P type source/drain region and the N type source/drain region.

Here, functional principles and the like of the present invention will be described. The inventor of the present invention carried out research to realize a method of manufacturing a semiconductor device which can attain the above-mentioned objects of the present invention. As a result of the research, the inventor has found the cause why, in the prior art, a sheet resistance value of a metal silicide film formed on a P type gate electrode and a P type source/drain region becomes large when compared with a sheet resistance value of a metal silicide film formed on an N type gate electrode and an N type source/drain region. The cause is that if the temperature of a substrate in a process of cobalt sputtering is too high, dicobalt monosilicide whose grain growth is insufficient easily becomes cobalt monosilicide. Taking such cause into consideration, the inventor proposes the following manufacturing methods to attain the object of the present invention.

In a first manufacturing method, at first, cobalt is deposited on a substrate by sputtering, while heating the substrate at a temperature approximately equal to 200 degrees Celsius. Subsequently, the substrate is transferred to another chamber without exposing it to the atmosphere, and, while heating the substrate at a temperature within a temperature range from a temperature higher than or equal to 300 degrees Celsius to a tempeature lower than or equal to 400 degrees Celsius, cobalt is deposited on the substrate by sputtering.

Alternatively, in a second manufacturing method, at first, cobalt is deposited on a substrate by sputtering, while heating the substrate at a temperature approximately equal to 200 degrees Celsius. Subsequently, the substrate is transferred to another chamber without exposing it to the atmosphere, and the substrate is heated, or heat treated, at a temperature within a temperature range from a temperature higher than or equal to 300 degrees Celsius to a tempeature lower than or equal to 400 degrees Celsius for a time period equal to or longer than 2 minutes, that is, the film comprising cobalt formed on the substrate is heated at a temperature within a temperature range from a temperature higher than or equal to 300 degrees Celsius to a tempeature lower than or equal to 400 degrees Celsius for a time period equal to or longer than 2 minutes.

The first and the second methods mentioned briefly above will be further explained in detail. In both methods, a silicon substrate on which a predetermined structure including transistors and the like is formed is first prepared. Then, a native oxide film on the surface of the silicon substrate is removed by the etching which uses aqueous solution of hydrofluoric acid. Thereafter, the silicon substrate is transferred into a first chamber of a sputtering apparatus.

Next, in case of the first manufacturing method, cobalt is deposited on whole area of the substrate by sputtering in the first chamber, while heating the substrate at a temperature approximately equal to 200 degrees Celsius. Subsequently, the substrate is transferred to a second chamber which is different from the first chamber without exposing the substrate to the atmosphere, and, while heating the substrate at a temperature within a temperature range from a temperature higher than or equal to 300 degrees Celsius to a temperature lower than or equal to 400 degrees Celsius, cobalt is deposited on whole area of the substrate by sputtering.

In case of the second manufacturing method, at first, cobalt is deposited on the substrate by sputtering in the first chamber, while heating the substrate at a temperature approximately equal to 200 degrees Celsius. Subsequently, the substrate is transferred to a second chamber which is different from the first chamber without exposing the substrate to the atmosphere, and the substrate is heated, or heat treated, at a temperature within a temperature range from a temperature higher than or equal to 300 degrees Celsius to a tempeature lower than or equal to 400 degrees Celsius for a time period equal to or longer than 2 minutes, that is, the film comprising cobalt formed on the substrate is heated at a temperature within a temperature range from a temperature higher than or equal to 300 degrees Celsius to a tempeature lower than or equal to 400 degrees Celsius for a time period equal to or longer than 2 minutes.

Additionally, in a manufacturing method of comparative example, cobalt is deposited on whole area of the substrate by one step sputtering in the first chamber, while heating the substrate at a temperature approximately equal to 450 degrees Celsius. This method corresponds to the above-mentioned conventional method.

Thereafter, in each of these three manufacturing methods, the following process steps are sequentially performed. That is, a first heat treatment process, that is, a first rapid thermal annealing (RTA) process; a process of removing a cobalt film deposited on sidewall spacers, a field oxide film and the like by wet etching; and a second heat treatment process, that is, a second rapid thermal annealing (RTA) process are performed sequentially. Then, sheet resistance values of a cobalt silicide film, that is, a cobalt disilicide film, finally formed on the P type gate electrode and on the N type gate electrode were measured and compared.

As a result of the measurement, the sheet resistance value of the cobalt silicide film on the P type gate electrode formed by each of the first and second manufacturing methods became smaller than the sheet resistance of the cobalt silicide film on the P type gate electrode formed by the manufacturing method of comparative example, by approximately 10 percent or more. On the other hand, with respect to the sheet resistance value of the cobalt silicide film on the N type gate electrode, there was no significant difference among the first manufacturing method, the second manufacturing method and the manufacturing method of comparative example. Also, the sheet resistance value of the cobalt silicide film on the P type gate electrode formed by each of the first and second manufacturing methods is approximately the same as that of the sheet resistance value of the cobalt silicide film on the N type gate electrode formed by each of the first and second manufacturing methods.

The cause of such result was analyzed and it was found that the following phenomenon occurs on the P type silicon substrate or the P type silicon film, here on the P type gate electrode.

In the first manufacturing method, cobalt was deposited on the substrate by sputtering while heating the substrate to a low temperature of approximately 200 degrees Celsius, and, thereafter, cobalt was further deposited on the substrate while heating the substrate to a relatively high temperature between a temperature equal to or higher than 300 degrees Celsius and a temperature equal to or lower than 400 degrees Celsius. Therefore, after sufficient progress of the grain growth of dicobalt monosilicide ($Co_2Si$) produced at first, phase change occurs from dicobalt monosilicide ($Co_2Si$) to cobalt monosilicide (CoSi). Thus, productive reaction of dicobalt monosilicide ($Co_2Si$) which is a first reaction of forming silicide easily progresses and unreacted cobalt does not remain. A dicobalt monosilicide film, which may contain cobalt monosilicide portion, further reacts with silicon within the silicon substrate or the silicon film in the first heat treatment process performed after sputtering to produce a cobalt monosilicide (CoSi) film, which may contain cobalt disilicide portion. This cobalt monosilicide film is not removed in the wet etching process performed after the first heat treatment process, and further reacts with silicon in a second heat treatment process performed after the wet etching process to form a cobalt disilicide ($CoSi_2$) film. Therefore, the thickness of the finally formed cobalt disilicide film is not reduced.

As a result, according to the first manufacturing method mentioned above, the sheet resistance value of the cobalt disilicide film on the P type gate electrode becomes as low as the sheet resistance of the cobalt disilicide film on the N type gate electrode. Also, similarly to the cobalt disilicide film on the gate electrode, the sheet resistance value of the cobalt disilicide film on the P type source/drain region becomes as low as the sheet resistance of the cobalt disilicide film on the N type source/drain region.

Also, in the second manufacturing method, the thickness of the cobalt disilicide ($CoSi_2$) film finally formed on the P type gate electrode is not reduced for similar reason. As a result, the sheet resistance value of the cobalt disilicide film on the P type gate electrode becomes as low as the sheet resistance of the cobalt disilicide film on the N type gate electrode. Also, similarly to the cobalt disilicide film on the gate electrode, the sheet resistance value of the cobalt disilicide film on the P type source/drain region becomes as low as the sheet resistance of the cobalt disilicide film on the N type source/drain region.

On the other hand, in the manufacturing method of the comparative example, cobalt is deposited on the substrate in a sputtering process of one step. That is, cobalt is deposited on the substrate by sputtering, while heating the substrate at a high temperature of approximately 450 degrees Celsius. Therefore, in a condition the grain growth of dicobalt monosilicide ($Co_2Si$) produced at first has not yet progressed sufficiently, phase change occurs from dicobalt monosilicide ($Co_2Si$) to cobalt monosilicide (CoSi). Thus, reaction of deposited metal cobalt with silicon to produce dicobalt monosilicide ($Co_2Si$) is suppressed. Therefore, unreacted metal cobalt film portion remains at an upper portion of a film deposited by sputtering, and the remained metal cobalt film portion is oxidized and a film of cobalt oxide is formed. This cobalt oxide film does not change in the first heat treatment process performed after sputtering, and is removed in a wet etching process performed after the first heat treatment process. Therefore, the thickness of a cobalt disilicide (CoSi) film finally formed on the P type gate electrode by a second heat treatment process is reduced.

As a result, according to the manufacturing method of comparative example mentioned above, the sheet resistance value of the cobalt disilicide film on the P type gate electrode becomes larger than the sheet resistance of the cobalt disilicide film on the N type gate electrode. Also, similarly to the cobalt disilicide film on the gate electrode, the sheet resistance value of the cobalt disilicide film on the P type source/drain region becomes larger than the sheet resistance of the cobalt disilicide film on the N type source/drain region.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which:

FIGS. 1A and 1B and FIGS. 2A and 2B are cross sectional views illustrating, in order of process steps, cross sectional structures of a portion of a semiconductor device substrate obtained after respective process steps according to a method of manufacturing a semiconductor device of the present invention;

DESCRIPTION OF A PREFERRED EMBODIMENT

Figure 2A:
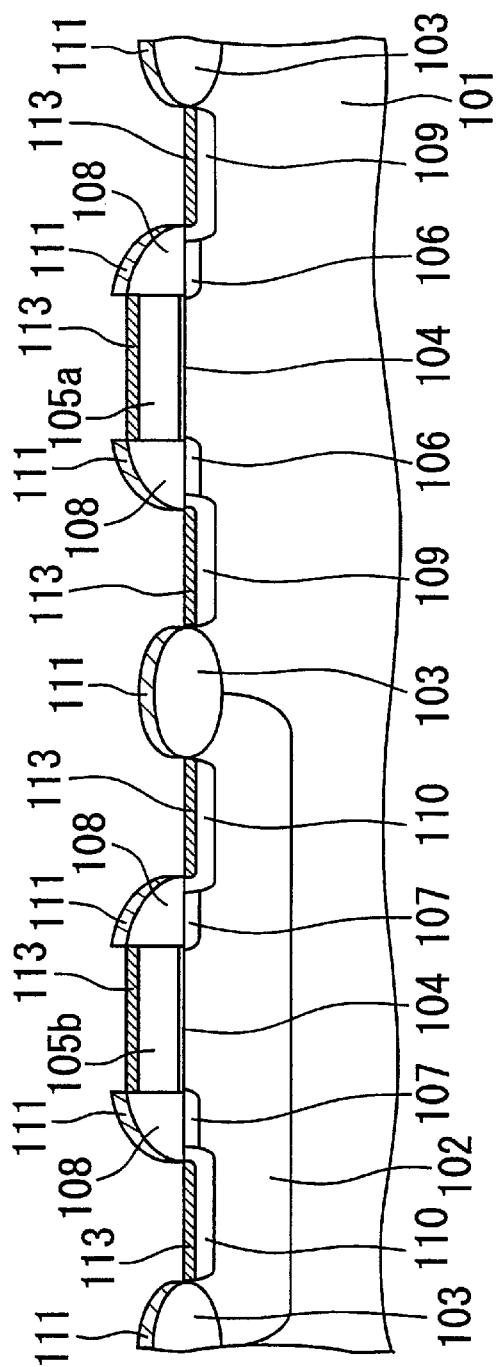

Embodiments of the present invention will now be described in detail with reference to the drawings.

FIGS. 1A and 1B and FIGS. 2A and 2B are illustrations, in order of process steps, of cross-sectional views of a portion of a semiconductor device substrate obtained after respective process steps according to a method of manufacturing a semiconductor device as a first embodiment of the present invention. The method of manufacturing a semiconductor device of the first embodiment corresponds to the above-mentioned first method.

First, as shown in FIG. 1A, an N type well 102 is formed at an area of a silicon wafer or silicon substrate 101 where a P channel transistor is to be formed, by using a known method, for example, an ion implantation method and the like. Then, on the surface of the silicon substrate 101, a field oxide film 103 is formed by using a selective oxidation method. A gate insulating film 104 made of silicon oxide film and the like is then formed in an active area surrounded by the field oxide film 103, and a polycrystalline silicon (polysilicon) film which becomes a gate electrode is formed on the gate insulating film 104. Phosphorus is then doped into the polysilicon film by using a known method, thereby electrical resistivity of the polysilicon film is lowered. Thereafter, by using a well known photolithography method and a well known dry etching method, the polysilicon film is patterned, and the gate electrode 105 is formed as shown in FIG. 1A.

Next, by an ion implantation method which uses the gate electrode 105, the field oxide film 103 and a resist film not shown in the drawing and formed by a photolithography method as a mask, N type impurity diffused layers 106 having a predetermined low impurity concentration are formed in an active area of the silicon substrate 101 in which an N channel transistor is to be formed. Similarly, by an ion implantation method which uses the gate electrode 105, the field oxide film 103 and a resist film not shown in the drawing and formed by a photolithography method as a mask, P type impurity diffused layers 107 having a predetermined low impurity concentration are formed in the N well 102. Thereafter, on side surfaces of the gate electrode 105, sidewall spacers 108 made of silicon oxide films or silicon nitride films are formed by using a known CVD technology and a known etching technology.

Thereafter, by an ion implantation method which uses the gate electrode 105, the sidewall spacers 108, the field oxide film 103 and a resist film not shown in the drawing and formed by a photolithography method as a mask, N type source/drain regions 109 having a higher impurity concentration than that of the N type impurity diffusion layers 106 are formed in an active area of the silicon substrate 101 in which the N channel transistor is to be formed. Similarly, by an ion implantation method which uses the gate electrode 105, the sidewall spacers 108, the field oxide film 103 and a resist film not shown in the drawing and formed by a photolithography method as a mask, P type source/drain regions 110 having a higher impurity concentration than that of the P type impurity diffused layers 107 are formed in the N well 102. After the ion implantation, heat treatment process is performed if necessary. By these process steps, the N type source/drain region 109 and the P type source/drain region 110 are formed as a lightly doped drain (LDD) structure. Thereby, the structure shown in FIG. 1A is obtained.

It should be noted that, in the ion implantation process for forming the N type source/drain region 109 and the ion implantation process for forming the P type source/drain region 110, the gate electrode 105 is used as a mask and impurities are also injected into the gate electrode 105. Therefore, the gate electrode 105 on the side of the N channel transistor has N conductivity type at least at an upper portion thereof, and is called an N type gate electrode 105a hereafter. Also, the gate electrode 105 on the side of the P channel transistor has P conductivity type at least at an upper portion thereof, and is called a P type gate electrode 105b hereafter.

Then, a native oxide film not shown in the drawing and formed on the surface of the polysilicon film as the gate electrode and on the surface of the silicon substrate is removed by etching and the like. The substrate is then placed into a first chamber of a magnetron sputtering apparatus not shown in the drawing. Cobalt, which is a metal having a high melting point, is deposited by sputtering on whole surface of the substrate while heating the substrate at a temperature of approximately 200 degrees Celsius or so. The substrate is heated, for example, by heating a substrate holder on which the substrate is placed. Thereby, as shown in FIG. 1B, a cobalt film 111 is formed on the field oxide film 103, the sidewall spacers 108 and the like. On the other hand, a cobalt film deposited on the N type gate electrode 105a, the P type gate electrode 105b, the N type source/drain region 109 and the P type source/drain region 110 chemically reacts with underlying material, that is, single crystalline silicon or polysilicon via surface reaction to form a dicobalt monosilicide ($Co_2Si$) film 112. In this dicobalt monosilicide ($Co_2Si$) film 112, cobalt monosilicide (CoSi) is hardly formed.

Thereafter, the substrate is transferred to and placed in a second chamber which is different from the first chamber without exposing the substrate to the atmosphere. Then, while heating the substrate at a temperature within a temperature range approximately from 300 degrees Celsius to 400 degrees Celsius, cobalt is deposited on whole area of the substrate by sputtering. Thereby, in the dicobalt monosilicide ($Co_2Si$) film 112, there occurs grain growth of the dicobalt monosilicide ($Co_2Si$), and the thickness of the dicobalt monosilicide film 112 increases. Also, the thickness of the cobalt film 111 on the field oxide film 103 and on the sidewall spacers 108 increases. It is more preferable that, also after the sputtering is finished, that is, also after the deposition of cobalt is finished, the substrate is heated at a temperature, for example, approximately 300 through 400 degrees Celsius, for a predetermined time period, for example, 2 minutes or more in the second chamber. Thereby, it is possible to surely prevent unreacted cobalt portion from remaining in the dicobalt monosilicide film 112.

Next, as shown in FIG. 2A, a rapid thermal annealing (RTA) process is performed in nitrogen atmosphere at a temperature equal to or higher than 500 degrees Celsius. Thereby, reaction of the dicobalt monosilicide ($Co_2Si$) portions on the N type gate electrode 105a, the P type gate electrode 105b, the N type source/drain region 109 and the P type source/drain region 110 is further progressed and a film 113 comprising cobalt monosilicide and/or cobalt disilicide ($CoSi_2$) is formed.

The cobalt film 111 existing on the field oxide film 103 and the sidewall spacers 108 becomes a film in which a part of, for example, the surface portion of, the film is oxidized. At the most upper portions of the P type gate electrode 105b and the P type source/drain region 110, a cobalt film and an oxide film of cobalt are not formed.

Figure 2B:
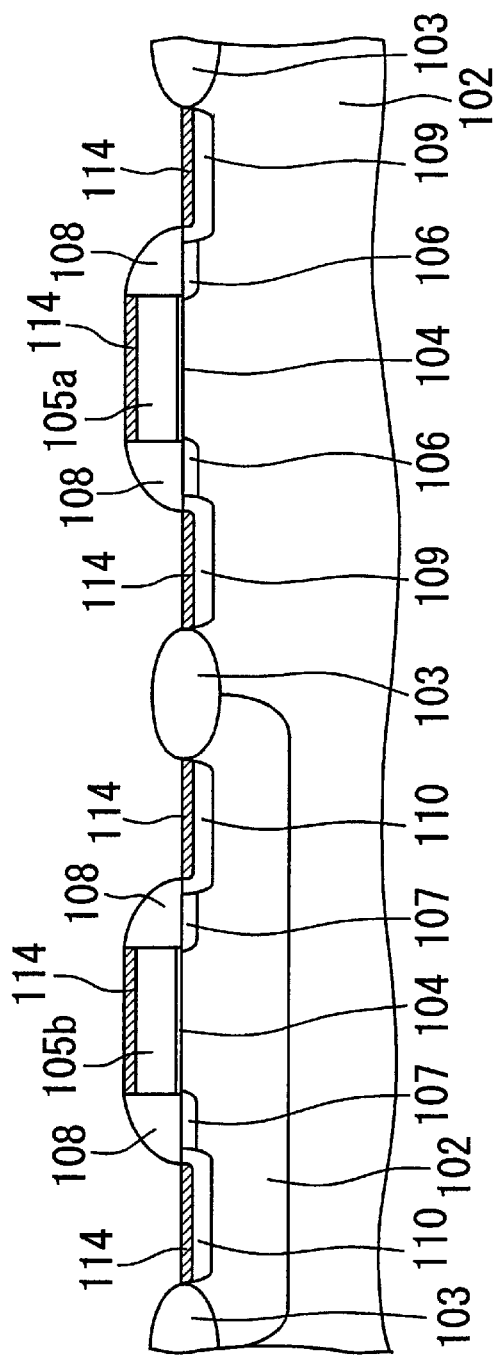

As shown in FIG. 2B, the substrate is then immersed in a mixed aqueous solution of hydrochloric acid and hydrogen peroxide. By such wet etching, the cobalt film portion which is left unreacted or which is partially oxidized is selectively removed. Then, an RTA process is performed at a temperature higher than that of the above-mentioned RTA, for example, at 800 degrees Celsius. By this process, cobalt monosilicide in the film 113 is completely reacted to form the cobalt disilicide film 114. Thereby, a structure shown in FIG. 2B is obtained.

In a semiconductor device, for example, a MOS type field effect transistor, manufactured according to this embodiment, a cobalt disilicide film formed on each of the N type gate electrode, the P type gate electrode, the N type source/drain region, and the P type source/drain region in a self-aligned manner has a good surface profile and low sheet resistance.

Next, an explanation will be made on a manufacturing method according to the second embodiment of the present invention. The manufacturing method according to the second embodiment corresponds to the second method mentioned before. Since cross-sectional views of a portion of a semiconductor device substrate obtained during respective process steps in the method according to this embodiment are substantially similar to those shown in FIGS. 1A and 1B and FIGS. 2A and 2B, an explanation on this method will also be made with reference to these drawings.

In the method according to the second embodiment, a gate electrodes 105, sidewall spacers 108, LDD structures including an N type source/drain region 109 and a P type source/drain region 110, and the like are formed by using process steps similar to those of the first embodiment. Therefore, until the cross sectional structure of FIG. 1A is obtained, the process steps in the second embodiment may be the same as those of the first embodiment.

Then, a native oxide film not shown in the drawing and formed on the surface of the polysilicon film as the gate electrode and on the surface of the silicon substrate is removed by etching and the like. The substrate is then placed into a first chamber of a magnetron sputtering apparatus not shown in the drawing. Cobalt, which is a metal having a high melting point, is deposited by sputtering on whole surface of the substrate while heating the substrate to a temperature of approximately 200 degrees Celsius or so. The substrate is heated, for example, by heating a substrate holder on which the substrate is placed. Thereby, as shown in FIG. 1B, a cobalt film 111 is formed on the field oxide film 103, the sidewall spacers 108 and the like. On the other hand, a cobalt film deposited on the N type gate electrode 105a, the P type gate electrode 105b, the N type source/drain region 109 and the P type source/drain region 110 chemically reacts with underlying material, that is, single crystalline silicon or polysilicon via surface reaction to form a dicobalt monosilicide ($Co_2Si$) film 112. In this dicobalt monosilicide ($Co_2Si$) film 112, cobalt monosilicide (CoSi) is hardly formed.

Thereafter, the substrate is transferred to and placed in a second chamber which is different from the first chamber without exposing the substrate to the atmosphere. Then, the substrate is heated to a temperature approximately from 300 degrees Celsius to 400 degrees Celsius for a predetermined time, for example, for 2 minutes or more. Thereby, the dicobalt monosilicide ($Co_2Si$) film 112 is also heated, and, in the dicobalt monosilicide ($Co_2Si$) film 112, there occurs a grain growth of the dicobalt monosilicide ($Co_2Si$) and unreacted cobalt portion hardly remains.

Process steps hereafter, that is, process steps after those described with reference to FIG. 2A, are similar to those in the method of the first embodiment. That is, a rapid thermal annealing (RTA) process is performed in nitrogen atmosphere at a temperature equal to or higher than 500 degrees Celsius. Thereafter, the substrate is immersed in a mixed aqueous solution of hydrochloric acid and hydrogen peroxide to perform wet etching. Then, an RTA process is performed at a temperature higher than that of the above-mentioned RTA, for example, at 800 degrees Celsius. By this process, a cobalt disilicide film 114 is formed on the N type gate electrode 105a, the P type gate electrode 105b, the N type source/drain region 109, and the P type source/drain region 110.

In a semiconductor device, for example, a MOS type field effect transistor, manufactured according to this embodiment, a cobalt disilicide film formed on each of the N type gate electrode, the P type gate electrode, the N type source/drain region, and the P type source/drain region in a self-aligned manner has a good surface profile and low sheet resistance.

EXAMPLE 1

The inventor of the present invention carried out an experiment by providing sputtering chambers comprising a first chamber and a second chamber in a sputtering apparatus, i.e., Model No. I-1060 apparatus, manufactured by ANELVA Corporation. Condition of the experiment is as follows.

Sputtering material (i.e., target material): cobalt

Diameter of silicon wafer (substrate): 200 mm

First, in a manner as mentioned in the first embodiment, N type and P type gate electrodes and N type and P type diffusion layers, that is, N type and P type source/drain regions, are formed on a silicon substrate. Thereafter, by using the above-mentioned experiment apparatus, cobalt is deposited on the silicon substrate as mentioned below.

That is, the substrate is placed on a substrate holder in the first chamber, and cobalt is deposited on the substrate under the first sputtering condition mentioned below. Thereafter, the substrate is transferred to the second chamber without exposing it to the atmosphere, and place the substrate on a substrate holder in the second chamber. Cobalt is then deposited on the substrate under the second sputtering condition mentioned below. These processes correspond to those in the first embodiment mentioned above.

Sputtering Conditions

First Sputtering

Temperature of substrate holder
  (Heating temperature of substrate): 200 degrees Celsius;
  Pressure in the first chamber (Ar gas): 3–8 mTorr;
  Deposition thickness of cobalt: 50 angstroms.

Second sputtering

Temperature of substrate holder
  (Heating temperature of substrate): 350 degrees Celsius;
  Pressure in the second chamber (Ar gas): 3–8 mTorr;
  Deposition thickness of cobalt: 50 angstroms;
  Time for maintaining substrate heating in second chamber after second sputtering: 2 minutes.

Thereafter, a first rapid thermal annealing (RTA), an wet etching, and a second rapid thermal annealing were performed, as in the first embodiment.

Then, sheet resistance of a cobalt silicide film, that is, a cobalt disilicide film formed on each of the N type gate electrode, the P type gate electrode, the N type source/drain region, and the P type source/drain region was measured. Also, dependency of the sheet resistance value of the cobalt silicide film on a width of each gate electrode and a width of each diffusion layer was measured, while changing the width of each gate and the width of each diffusion layer to various values.

Also, as a comparative example, sheet resistance of a cobalt silicide film formed on each of the N type gate electrode, the P type gate electrode, the N type source/drain region, and the P type source/drain region in accordance with the conventional method mentioned before was measured. In the conventional method, in place of using the above-mentioned sputtering conditions, cobalt was deposited on the substrate to a thickness of 100 angstroms by using one step sputtering, while heating the substrate to a temperature of 450 degrees Celsius, and, even after the sputtering is finished, heating of the substrate was maintained for 2 minutes.

Figure 3:
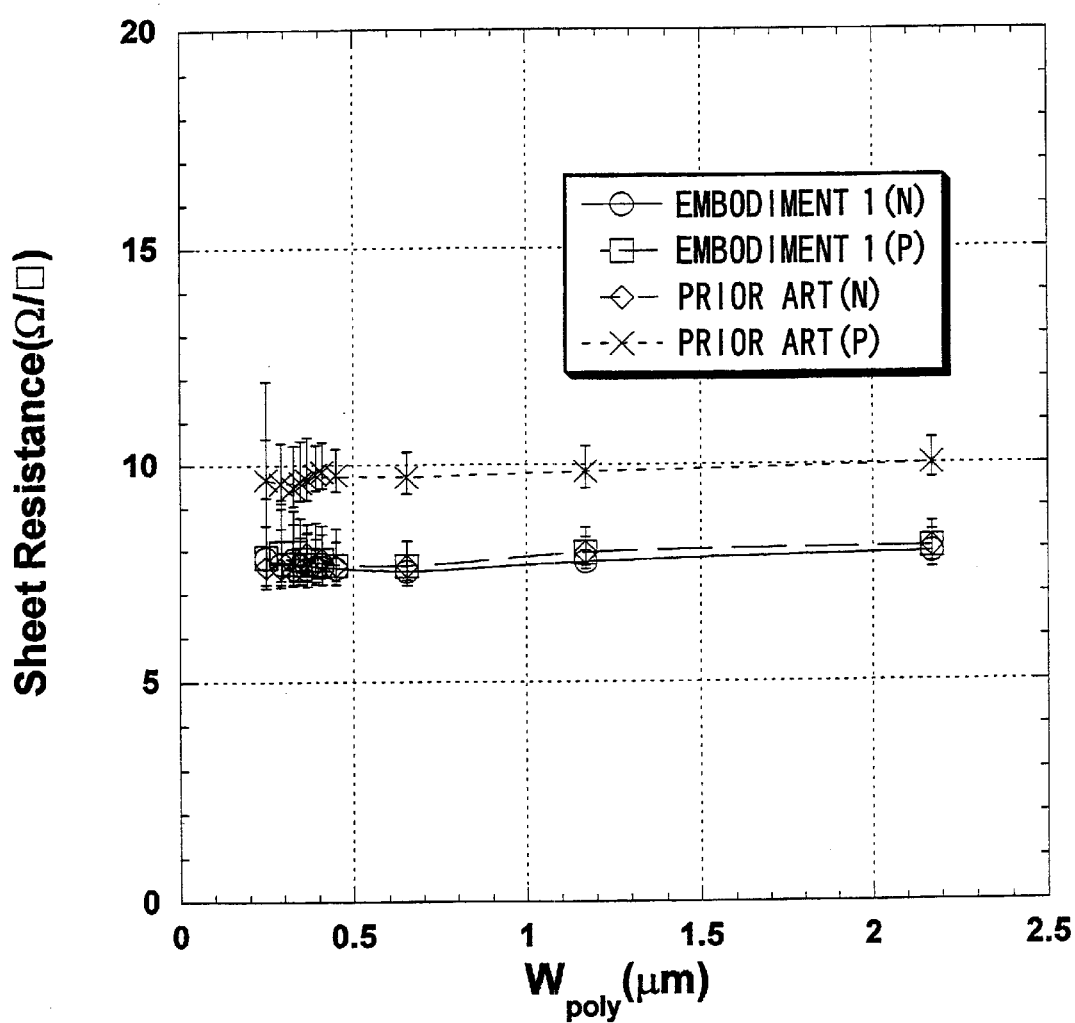
FIG. 3 is a graph showing relations between the gate electrode widths and the sheet resistances of the cobalt silicide films formed on the P type gate electrode and the N type gate electrode according to the method of the first embodiment and the conventional method.

FIG. 3 is a graph showing relations between the gate electrode widths and the sheet resistances of the cobalt silicide films formed on the P type gate electrode and the N type gate electrode according to the method of the first embodiment and the conventional method. Abscissa of the graph shows the gate electrode widths, and ordinate of the graph shows the sheet resistance of the cobalt silicide films formed on the gate electrodes.

Figure 4:
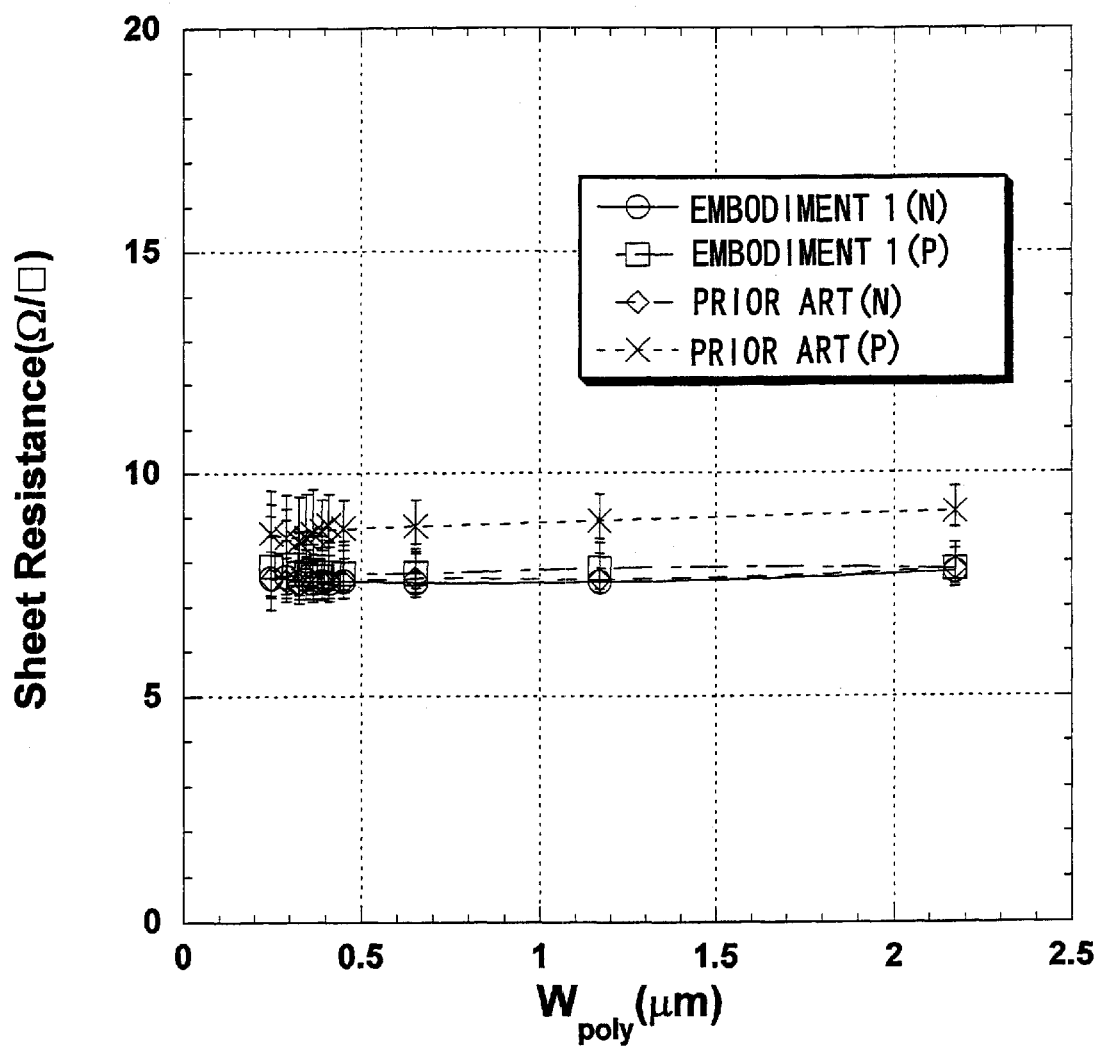
FIG. 4 is a graph showing relations between the widths of the diffusion layer and the sheet resistances of the cobalt silicide films formed on the P type diffusion layer and the N type diffusion layer according to the method of the first embodiment and the conventional method.

Also, FIG. 4 is a graph showing relations between the widths of the diffusion layer and the sheet resistances of the cobalt silicide films formed on the P type diffusion layer and the N type diffusion layer according to the method of the first embodiment and the conventional method. Abscissa of the graph shows the widths of the diffusion layer, and ordinate of the graph shows the sheet resistance of the cobalt silicide films formed on the diffusion layer.

As can be seen from FIG. 3 and FIG. 4, in the conventional method, the sheet resistance of the cobalt silicide film formed on the P type gate electrode and on the P type diffusion layer is relatively large. However, in the manufacturing method of the first embodiment, the sheet resistance of the cobalt silicide film formed on the N type gate electrode, the N type diffusion layer, the P type gate electrode and the P type diffusion layer is fairly low. In the conventional method, cobalt is deposited on the substrate to a thickness of 100 angstroms by sputtering while heating the substrate to a temperature of 450 degrees Celsius. Therefore, part of the cobalt film deposited on the P type gate electrode and on the P type diffusion layer does not form silicide. Therefore, thickness of the finally formed cobalt disilicide film is reduced and sheet resistance thereof becomes large. On the other hand, in the manufacturing method of the first embodiment, thickness of the cobalt disilicide film finally formed on the P type gate electrode and on the P type diffusion layer is not reduced, and sheet resistance thereof does not become large.

EXAMPLE 2

The inventor of the present invention carried out an experiment by providing sputtering chambers comprising a first chamber and a second chamber in a sputtering apparatus, i.e., Model No. I-1060 apparatus, manufactured by ANELVA Corporation. Condition of the experiment is as follows.

Sputtering material (i.e., target material): cobalt

Diameter of silicon wafer (substrate): 200 mm

First, in a manner as mentioned in the second embodiment, N type and P type gate electrodes and N type and P type diffusion layers, that is, N type and P type source/drain regions, are formed on a silicon substrate. Thereafter, by using the above-mentioned experiment apparatus, cobalt is deposited on the silicon substrate as mentioned below.

That is, the substrate is placed on a substrate holder in the first chamber, and cobalt is deposited on the substrate under the sputtering condition mentioned below. Thereafter, the substrate is transferred to the second chamber without exposing it to the atmosphere, and place the substrate on a substrate holder in the second chamber. The substrate is then annealed, that is, a film comprising cobalt formed on the substrate is annealed, under the annealing condition below. These processes correspond to those in the second embodiment mentioned above.

Sputtering Conditions

Temperature of substrate holder (Heating temperature of substrate): 200 degrees Celsius;

Pressure in the first chamber (Ar gas): 3–8 mTorr;

Deposition thickness of cobalt: 100 angstroms.

Annealing Conditions After Sputtering

Temperature of substrate holder (Heating temperature of substrate): 350 degrees Celsius;

Pressure in the second chamber (Ar gas): 3–8 mTorr;

Annealing time (heating time): 2 minutes.

Thereafter, a first rapid thermal annealing (RTA), an wet etching, and a second rapid thermal annealing were performed, as in the second embodiment.

Then, sheet resistance of a cobalt silicide film, that is, a cobalt disilicide film formed on each of the N type gate electrode, the P type gate electrode, the N type source/drain region, and the P type source/drain region was measured. Also, dependency of the sheet resistance value of the cobalt silicide film on a width of each gate electrode and a width of each diffusion layer was measured, while changing the width of each gate and the width of each diffusion layer to various values.

Also, as a comparative example, sheet resistance of a cobalt silicide film formed on each of the N type gate electrode, the P type gate electrode, the N type source/drain region, and the P type source/drain region in accordance with the conventional method mentioned before was measured. In the conventional method, in place of using the above-mentioned sputtering and annealing conditions, cobalt was deposited on the substrate to a thickness of 100 angstroms by using one step sputtering, while heating the substrate to a temperature of 450 degrees Celsius, and, even after the sputtering is finished, heating of the substrate was maintained for 2 minutes.

Figure 5:
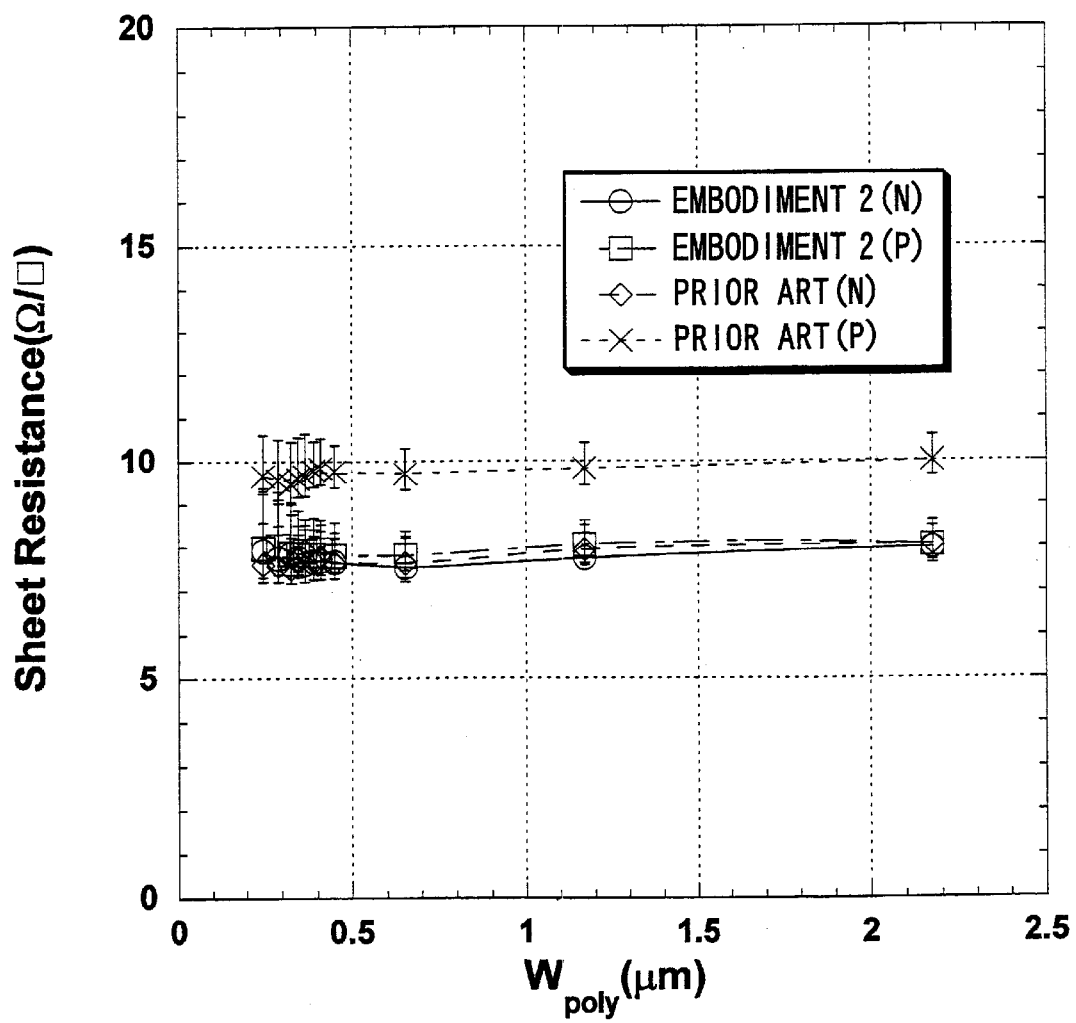
FIG. 5 is a graph showing relations between the gate electrode widths and the sheet resistances of the cobalt silicide films formed on the P type gate electrode and the N type gate electrode according to the method of the second embodiment and the conventional method.

FIG. 5 is a graph showing relations between the gate electrode widths and the sheet resistances of the cobalt silicide films formed on the P type gate electrode and the N type gate electrode according to the method of the second embodiment and the conventional method. Abscissa of the graph shows the gate electrode widths, and ordinate of the graph shows the sheet resistance of the cobalt silicide films formed on the gate electrodes.

Figure 6:
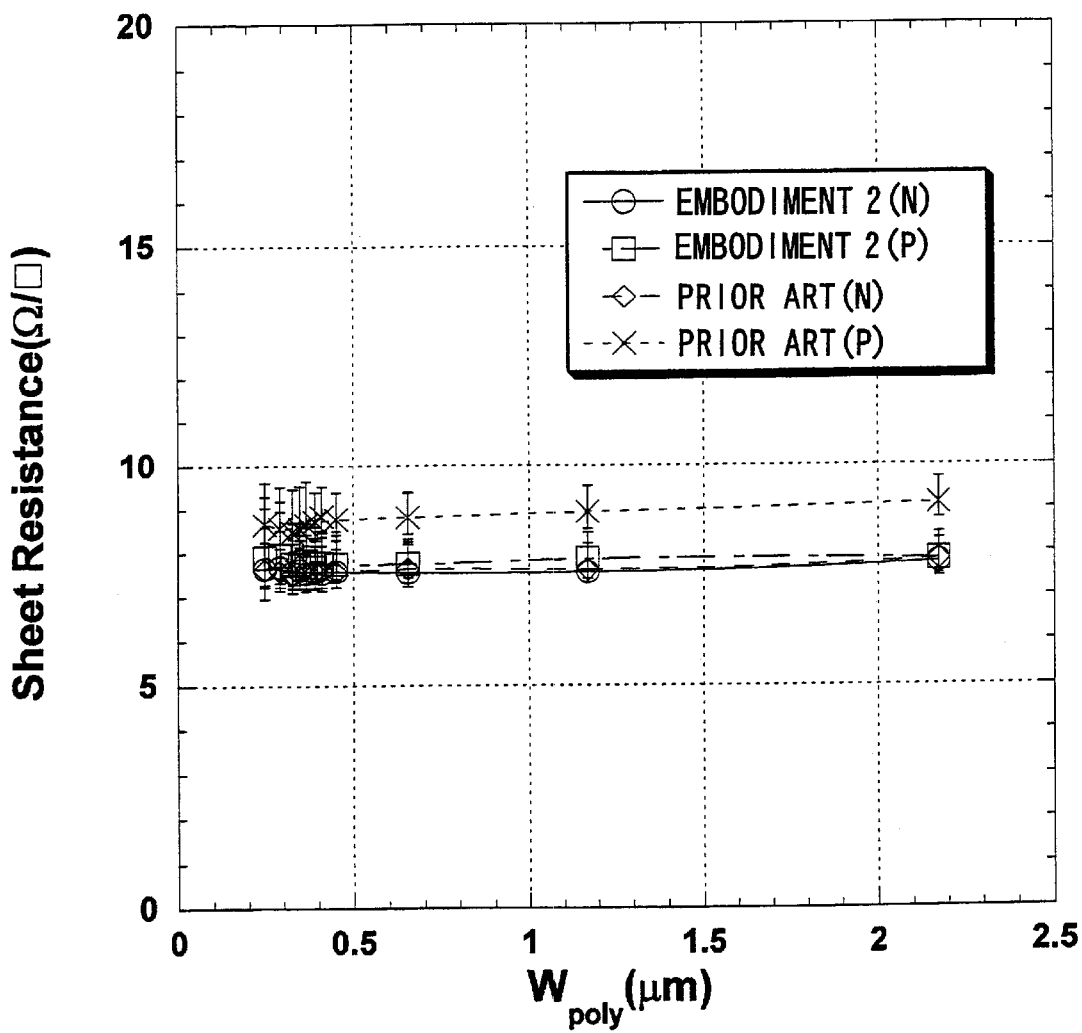
FIG. 6 is a graph showing relations between the widths of the diffusion layer and the sheet resistances of the cobalt silicide films formed on the P type diffusion layer and the N type diffusion layer according to the method of the second embodiment and the conventional method.
Figure 7A:
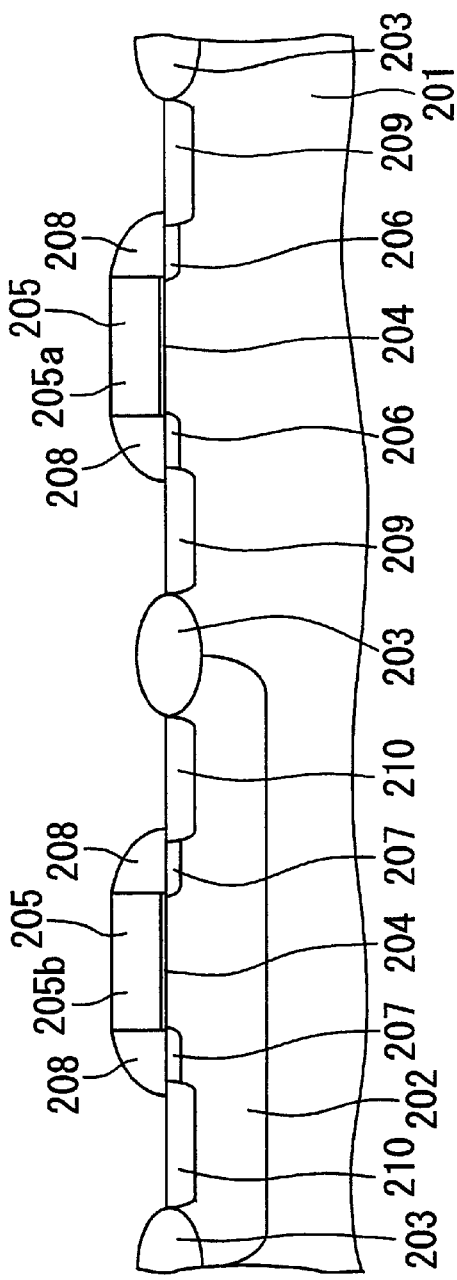
FIGS. 7A and 7B and FIGS. 8A and 8B are cross sectional views illustrating, in order of process steps, cross sectional structures of a portion of a semiconductor device substrate obtained after respective process steps according to a conventional method of manufacturing a semiconductor device.
Figure 7B:
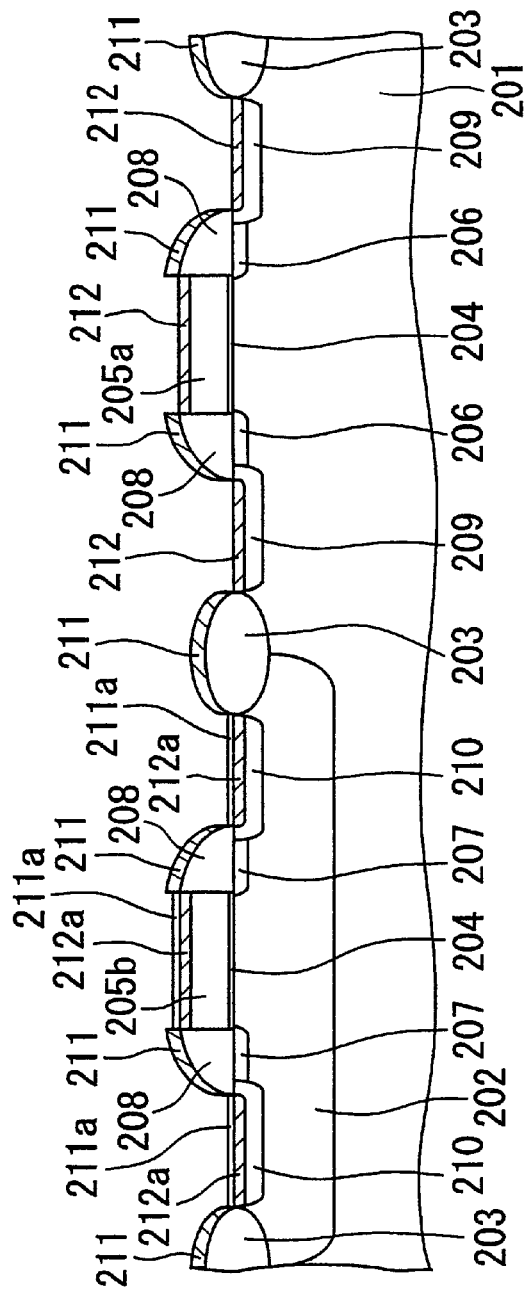
Figure 8A:
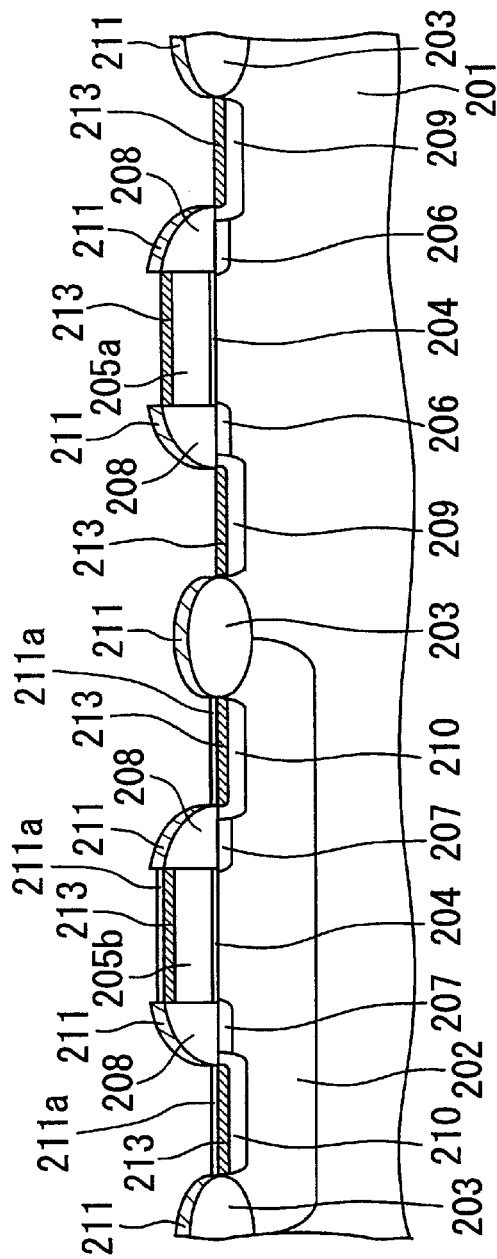
Figure 8B:
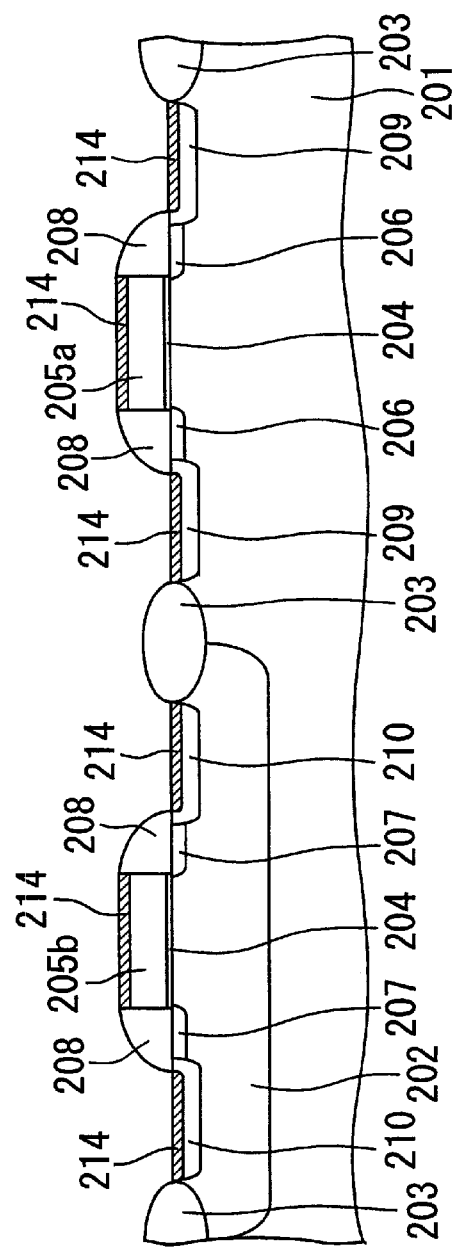

Also, FIG. 6 is a graph showing relations between the widths of the diffusion layer and the sheet resistances of the cobalt silicide films formed on the P type diffusion layer and the N type diffusion layer according to the method of the second embodiment and the conventional method. Abscissa of the graph shows the widths of the diffusion layer, and ordinate of the graph shows the sheet resistance of the cobalt silicide films formed on the diffusion layer.

As can be seen from FIG. 5 and FIG. 6, in the conventional method, the sheet resistance of the cobalt silicide film formed on the P type gate electrode and on the P type diffusion layer is relatively large. However, in the manufacturing method of the second embodiment, the sheet resistance of the cobalt silicide film formed on the N type gate electrode, the N type diffusion layer, the P type gate electrode and the P type diffusion layer is fairly low. In the conventional method, cobalt is deposited on the substrate to a thickness of 100 angstroms by sputtering while heating the substrate to a temperature of 450 degrees Celsius. Therefore, part of the cobalt film deposited on the P type gate electrode and on the P type diffusion layer does not form silicide. Therefore, thickness of the finally formed cobalt disilicide film is reduced and sheet resistance thereof becomes large. On the other hand, in the manufacturing method of the second embodiment, thickness of the cobalt disilicide film finally formed on the P type gate electrode and on the P type diffusion layer is not reduced, and sheet resistance thereof does not become large.

As mentioned above, according to the present invention, when a metal silicide layer having a high melting point is formed in an area surrounded by insulating film portions which are selectively formed on a semiconductor substrate, it is possible to silicify all portion of a cobalt film deposited by sputtering, without leaving unreacted portion of the cobalt film. Therefore, it is possible to further reduce resistance of gate electrodes and source/drain electrodes of MOS type field effect transistors (MOSFET's).

Also, when a metal silicide film is formed on a semiconductor substrate by depositing a metal having a high melting point on a semiconductor substrate by means of sputtering and by reacting the metal with the grounding layer, it is possible to fabricate the metal silicide film having a low sheet resistance value, without depending on the grounding layer.

Further, according to the present invention, it is possible to form a metal silicide film having approximately equal and low sheet resistance on an area comprising P type silicon and on an area comprising N type silicon simultaneously and in a self-aligned manner.

Still further, according to the present invention, it is possible to make wiring resistance of the P type gate electrode and the P type source/drain region of a P channel MOSFET as low as that of the N type gate electrode and the N type source/drain region of an N channel MOSFET.

Also, according to the present invention, it is possible to form a metal silicide film having approximately equal and low sheet resistance on the P type gate electrode, the P type source/drain region, the N type gate electrode and the N type source/drain region, simultaneously and in a self-aligned manner.

Further, according to the present invention, it is possible to make an operation speed of a P channel MOSFET as fast as that of an N channel MOSFET.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A method of manufacturing a semiconductor device in which a cobalt silicide layer is formed on a semiconductor substrate, said method comprising:

preparing said semiconductor substrate;

depositing cobalt on said semiconductor substrate by sputtering while heating said semiconductor substrate at a temperature approximately equal to 200 degrees Celsius; and after depositing cobalt on said semiconductor substrate by sputtering while heating said semiconductor substrate at a temperature approximately equal to 200 degrees Celsius, depositing cobalt on said semiconductor substrate by sputtering while heating said semiconductor substrate at a temperature between 300 degrees Celsius and 400 degrees Celsius without exposing said semiconductor substrate to the atmosphere.

2. A method of manufacturing a semiconductor device as set forth in claim 1, wherein said semiconductor substrate is a silicon substrate.

3. A method of manufacturing a semiconductor device as set forth in claim 1, wherein said cobalt silicide layer is a self-aligned silicide layer.

4. A method of manufacturing a semiconductor device as set forth in claim 1, further comprising, after depositing cobalt on said semiconductor substrate by sputtering while heating said semiconductor substrate at a temperature between 300 degrees Celsius and 400 degrees Celsius, rapid thermal annealing of said semiconductor substrate at a first temperature equal to or higher than 500 degrees Celsius in a nitrogen atmosphere.

5. A method of manufacturing a semiconductor device as set forth in claim 4, further comprising, after rapid thermal annealing of said semiconductor substrate at said first temperature, wet etching said semiconductor substrate.

6. A method of manufacturing a semiconductor device as set forth in claim 5, further comprising, after wet etching, rapid thermal annealing of said semiconductor substrate at a second temperature higher than said first temperature.

7. A method of manufacturing a semiconductor device as set forth in claim 1, further comprising, after preparing semiconductor substrate and before depositing cobalt on said semiconductor substrate, forming at least one of a gate electrode and an impurity diffusion layer on said semiconductor substrate.

8. A method of manufacturing a semiconductor device as set forth in claim 1, further comprising, after preparing semiconductor substrate and before depositing cobalt on said semiconductor substrate, forming a P type gate electrode, an N type gate electrode, a P type source/drain region and an N type source/drain region on said semiconductor substrate.

9. A method of manufacturing a semiconductor device as set forth in claim 8, wherein said cobalt is deposited on said P type gate electrode, said N type gate electrode, said P type source/drain region and said N type source/drain region.

10. A method of manufacturing a semiconductor device as set forth in claim 9, wherein said cobalt silicide layer is formed in a self-aligned manner on said P type gate electrode, said N type gate electrode, said P type source/drain region and said N type source/drain region by silicification of cobalt deposited on said P type gate electrode, said N type gate electrode, said P type source/drain region and said N type source/drain region.

11. A method of manufacturing a semiconductor device in which a cobalt suicide layer is formed on a semiconductor substrate, said method comprising:

preparing said semiconductor substrate;

depositing cobalt on said semiconductor substrate by sputtering while heating said semiconductor substrate at a temperature approximately equal to 200 degrees Celsius; and heating said cobalt deposited on said semiconductor substrate at a temperature between 300 degrees Celsius and 400 degrees Celsius for at least two minutes without exposing said semiconductor substrate to the atmosphere.

12. A method of manufacturing a semiconductor device as set forth in claim 11, wherein said semiconductor substrate is a silicon substrate.

13. A method of manufacturing a semiconductor device as set forth in claim 11, wherein said cobalt silicide layer is a self-aligned silicide layer.

14. A method of manufacturing a semiconductor device as forth in claim 11, further comprising, after heating said cobalt on said semiconductor substrate at a temperature between 300 degrees Celsius and 400 degrees Celsius at least two minutes, rapid thermal annealing of said semiconductor substrate at a first temperature equal to or higher than 500 degrees Celsius in a nitrogen atmosphere.

15. A method of manufacturing a semiconductor device as set forth in claim 14, further comprising, after rapid thermal annealing of said semiconductor substrate at said first temperature, wet etching said semiconductor substrate.

16. A method of manufacturing a semiconductor device as set forth in claim 15, further comprising, after wet etching, rapid thermal annealing of said semiconductor substrate at a second temperature higher than said first temperature.

17. A method of manufacturing a semiconductor device as set forth in claim 11, further comprising, after preparing semiconductor substrate and before depositing cobalt on said semiconductor substrate, forming at least one of a gate electrode and an impurity diffusion layer on said semiconductor substrate.

18. A method of manufacturing a semiconductor device as set forth in claim 11, further comprising, after preparing semiconductor substrate and before depositing cobalt on said semiconductor substrate, forming a P type gate electrode, an N type gate electrode, a P type source/drain region and an N type source/drain region on said semiconductor substrate.

19. A method of manufacturing a semiconductor device as set forth in claim 18, wherein cobalt is deposited on said P type gate electrode, said N type gate electrode, said P type source/drain region and said N type source/drain region.

20. A method of manufacturing a semiconductor device as set forth in claim 19, wherein said cobalt silicide layer is formed in a self-aligned manner on said P type gate electrode, said N type gate electrode, said P type source/drain region and said N type source/drain region by silicification of cobalt deposited on said P type gate electrode, said N type gate electrode, said P type source/drain region and said N type source/drain region.

21. A method of manufacturing a semiconductor device as set forth in claim 1, further comprising, after depositing cobalt on said semiconductor substrate by sputtering while heating said semiconductor substrate at a temperature between 300 degrees Celsius and 400 degrees Celsius, rapid thermal annealing of said semiconductor substrate at a first temperature equal to or higher than 500 degrees Celsius in a nitrogen atmosphere, thereby forming a cobalt film on a first portion of said semiconductor substrate.

22. A method of manufacturing a semiconductor device as set forth in claim 21, further comprising, after rapid thermal annealing of said semiconductor substrate at said first temperature, removing at least a portion of said cobalt film on said semiconductor substrate by wet etching.

23. A method of manufacturing a semiconductor device as set forth in claim 1, further comprising, after depositing cobalt on said semiconductor substrate by sputtering while heating said semiconductor substrate at a temperature between 300 degrees Celsius and 400 degrees Celsius, rapid thermal annealing of said semiconductor substrate at a first temperature equal to or higher than 500 degrees Celsius in a nitrogen atmosphere, thereby forming cobalt oxide on a second portion of said semiconductor substrate.

24. A method of manufacturing a semiconductor device as set forth in claim 23, further comprising, after rapid thermal annealing of said semiconductor substrate at said first temperature, removing at least a portion of said cobalt oxide on said semiconductor substrate by wet etching.

25. A method of manufacturing a semiconductor device as forth in claim 11, further comprising, after heating said cobalt on said semiconductor substrate at a temperature between 300 degrees Celsius and 400 degrees Celsius at least two minutes, rapid thermal annealing of said semiconductor substrate at a first temperature equal to or higher than 500 degrees Celsius in a nitrogen atmosphere, thereby forming a cobalt film on a first portion of said semiconductor substrate.

26. A method of manufacturing a semiconductor device as set forth in claim 25, further comprising, after rapid thermal annealing of said semiconductor substrate at said first temperature, removing at least a portion of said cobalt film on said semiconductor substrate by wet etching.

27. A method of manufacturing a semiconductor device as forth in claim 11, further comprising, after heating said cobalt on said semiconductor substrate at a temperature between 300 degrees Celsius and 400 degrees Celsius at least two minutes, rapid thermal annealing of said semiconductor substrate at a first temperature equal to or higher than 500 degrees Celsius in a nitrogen atmosphere, thereby forming cobalt oxide on a second portion of said semiconductor substrate.

28. A method of manufacturing a semiconductor device as set forth in claim 27, further comprising, after rapid thermal annealing of said semiconductor substrate at said first temperature, removing at least a portion of said cobalt oxide on said semiconductor substrate by wet etching.

* * * * *